United States Patent
Golenzer et al.

(10) Patent No.: US 9,886,531 B2
(45) Date of Patent: Feb. 6, 2018

(54) DEVICE AND METHOD FOR LOCATING IMPACTS ON THE OUTER SURFACE OF A BODY

(71) Applicant: AIRBUS (S.A.S.), Toulouse (FR)

(72) Inventors: Jerome Golenzer, Gagnac sur Garonne (FR); Cedric Chamfroy, Bruguieres (FR); Julien Bardelli, Colomiers (FR)

(73) Assignee: Airbus (S.A.S.), Blagnac (FR)

( * ) Notice: Subject to any disclaimer, the term of this patent is extended or adjusted under 35 U.S.C. 154(b) by 427 days.

(21) Appl. No.: 14/604,877

(22) Filed: Jan. 26, 2015

(65) Prior Publication Data

US 2015/0211848 A1 Jul. 30, 2015

(30) Foreign Application Priority Data

Jan. 27, 2014 (FR) ..................... 14 50637

(51) Int. Cl.
*G05B 13/02* (2006.01)
*G06F 17/50* (2006.01)
*G01M 17/00* (2006.01)
*G01B 21/04* (2006.01)

(52) U.S. Cl.
CPC ............. *G06F 17/50* (2013.01); *G01B 21/04* (2013.01); *G01M 17/00* (2013.01)

(58) Field of Classification Search
None
See application file for complete search history.

(56) References Cited

U.S. PATENT DOCUMENTS

| 5,617,645 A * | 4/1997 | Wick ..................... G01B 11/24 250/559.23 |
| 2003/0206285 A1* | 11/2003 | Lau ........................ B25J 9/1692 356/4.09 |
| 2012/0081540 A1* | 4/2012 | Jang ..................... B64F 5/0045 348/128 |
| 2012/0223937 A1* | 9/2012 | Bendall .................. G01B 11/24 345/419 |
| 2013/0024165 A1 | 1/2013 | Tardu et al. |

OTHER PUBLICATIONS

Search Report for FR 1450637 dated Sep. 26, 2014, 2 pages.
(Continued)

*Primary Examiner* — Matthew G Marini
(74) *Attorney, Agent, or Firm* — Nixon & Vanderhye P.C.

(57) ABSTRACT

A method and device to locate an impact on an outer surface of a body including: locating the impact on the outer surface of a virtual model of the body; selecting a first and a second visual reference element on the virtual model; positioning an acquisition module on the outer surface of the actual body at the impact; measuring, using an acquisition module, measuring distances between the impact and the first visual reference element and between the impact and the second visual reference element; calculating a first arc around the first visual reference element and a second contour around the second visual reference element wherein each arc has a radius equal to one of the measured distances; determining a point of intersection of the first and second contours; and calculating coordinates of the point of intersection on the virtual model to locate the impact on the virtual body.

16 Claims, 4 Drawing Sheets

(56) References Cited

OTHER PUBLICATIONS

Allard et al., "Improvement of Aircraft Mechanical Damage Inspection with Advanced 3D Imaging Technologies", 5$^{th}$ International Symposium on NDT in Aerospace Improvement of Aircraft Mechanical Damage Inspection with Advanced 3D Imaging Technologies, vol. 18, No. 12, Dec. 1, 2013.

* cited by examiner

DEVICE AND METHOD FOR LOCATING IMPACTS ON THE OUTER SURFACE OF A BODY

RELATED APPLICATION

This disclosure incorporates by reference the complete disclosure of French patent application 1450637 filed Jan. 27, 2014.

BACKGROUND OF INVENTION

The present invention relates to a device and a method for determining the coordinates of an impact, such as for example a penetration resulting from the fall of an object or a collision with a bird, occurring on the outer surface of a body, such as the fuselage of an aircraft.

Locating impacts on the fuselage of an aircraft is currently carried out using a tape measure to measure the distances of the impact with respect to frames and stringers within the fuselage forming the internal structure of the fuselage. It is necessary to be very accurate in the determination of the position of an impact because the position of the impact has a direct effect on the decision taken regarding whether or not to keep the impacted aircraft in the fit to fly status.

The current method to determine the position of an impact requires an in-depth knowledge of the structure of the fuselage to locate from outside of the aircraft the internal frames and stringers near the impact. Locating these frames and stringers can be more difficult due to the paintwork and decorative stickers on the outer surface of the fuselage which obliterate numerous visual reference points. The accuracy of the measurement is heavily dependent on the ability of the operator declaring the impact incident.

BRIEF SUMMARY OF THE INVENTION

A method has been conceived and is disclosed herein for locating an impact on an outer surface of a body, comprising the following steps:
  a) modeling the body in a database to obtain a virtual model of said body;
  b) locating, via a man-machine interface, the impact on the outer surface of the virtual model of the body displayed on a display screen;
  c) selecting a first and a second visual reference element on the virtual model of the body;
  d) positioning an acquisition module on the outer surface of the body at the level of the impact;
  e) measuring, using an acquisition module, the distance, e.g., curvilinear distance, between the impact and the first visual reference element and the distance between the impact and the second visual reference element;
  f) calculating, as a function of the distances measured in the preceding step, by a central processing unit, on the virtual model of the body, a first contour around the first visual reference element and a second contour around the second visual reference element;
  g) determining, by the central processing unit, a point of intersection of the first and second contours; and
  h) calculating, by the central processing unit, the coordinates of said point of intersection on the virtual model of the body, the coordinates of said point being representative of the coordinates of the impact.

Using the above-described method, the locating of an impact on the outer surface of the fuselage requires only little knowledge of the internal structure of the fuselage, thus allowing more operators to carry out this locating which at present remains the responsibility of a very limited number of qualified persons.

SUMMARY OF THE DRAWINGS

Other features and advantages will emerge from the following description of the invention, this description being given solely by way of example and with reference to the appended drawings in which.

DETAILED DESCRIPTION OF THE INVENTION

Figure 1:
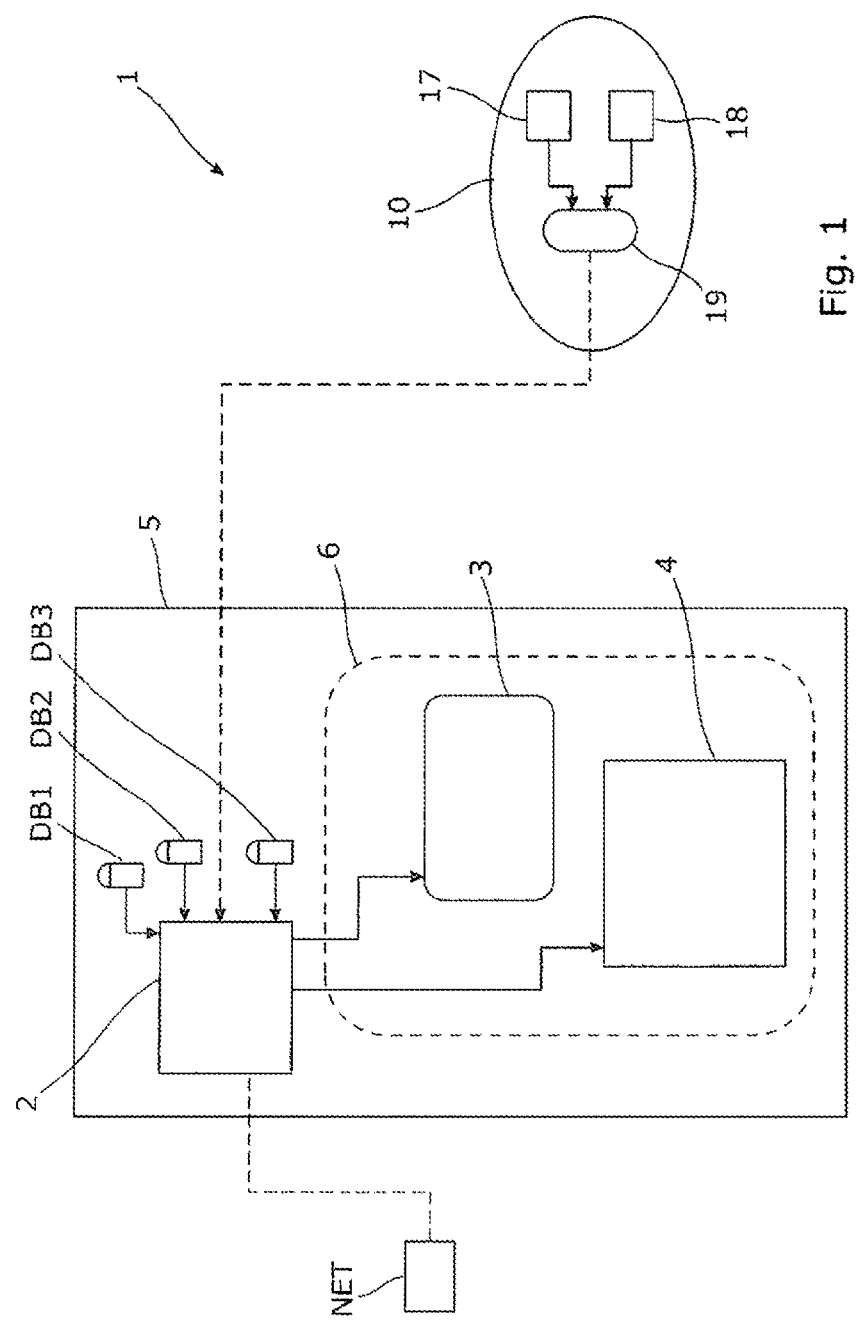
FIG. 1 is a block diagram of the device for locating impacts according to one embodiment of the invention in which said device comprises a touch sensitive tablet and an acquisition module.

FIG. 1 shows a device 1 for locating impacts on the outer surface (or skin) of the fuselage of an aircraft comprises a central processing unit 2 controlling a display device 3, a man-machine interface 4 and an acquisition module 5. The central processing unit 2, the display device and the man-machine interface are incorporated in a touch-sensitive tablet 5, of the type of those available commercially. The touch-sensitive screen 6 of the tablet 5 combines the functions of the display device and of the man-machine interface.

Figure 2:
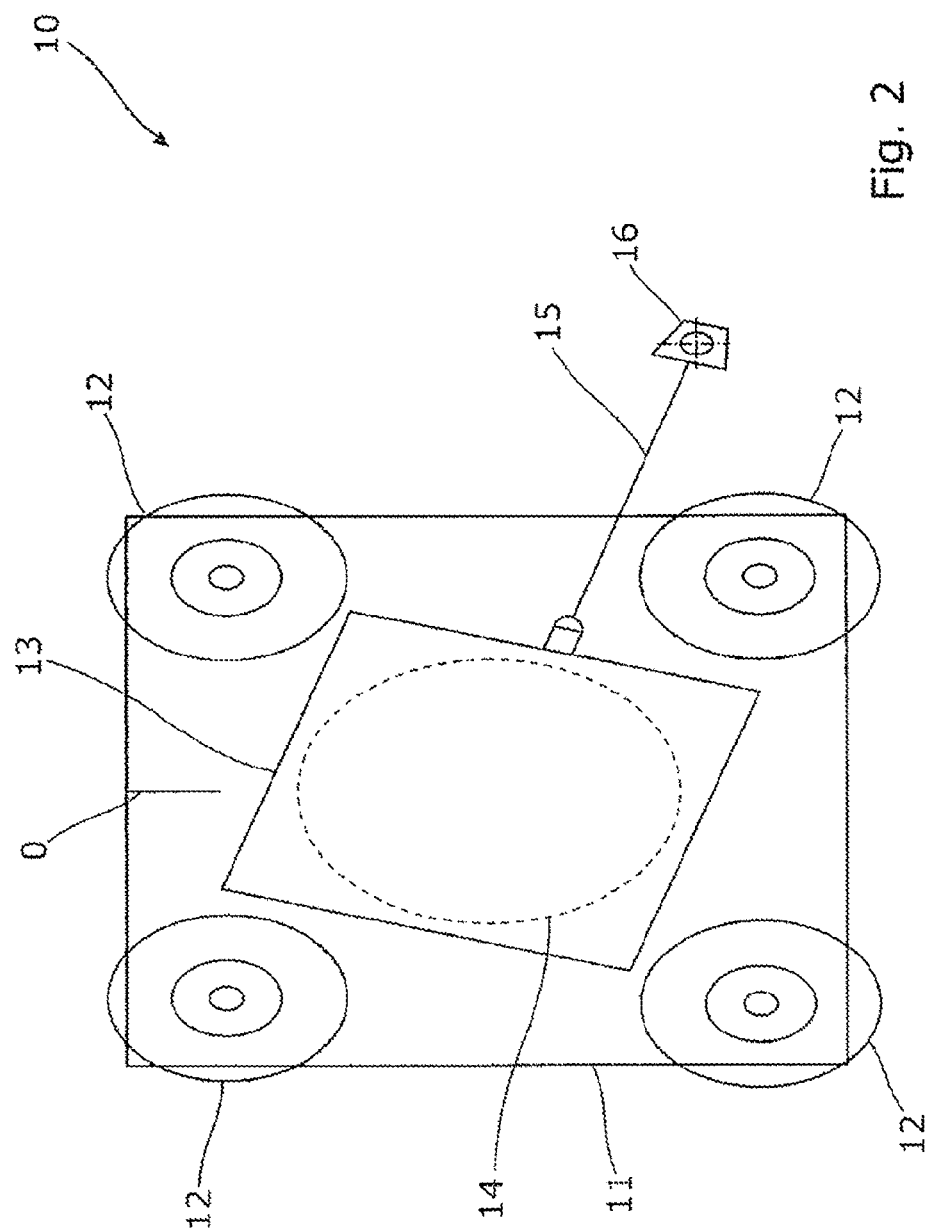
FIG. 2 is a diagrammatic plan view of the module shown in FIG. 1.

FIG. 2 shows an acquisition module 10 including a base 11 having a mechanism 12 that fixes the base to the fuselage of an aircraft. A measuring device 13 is fixed to the base via a chassis 14.

The base 11 may have the form of a transparent plate having a parallelepipedic shape including a first face. At each of the four corners of the base are fixed suction cups constituting the fixing mechanism 12. The chassis 14, for example of cylindrical shape, is connected such that it pivots with respect to the second face of the plate, with an axis of rotation perpendicular to the plane of the plate. The chassis 14 may be fixed to substantially the center of the plate.

The measuring device 13 may be in the form of a casing. Within the casing may be an angular sensor 17, a distance sensor 18 and communication paths 19 between the sensors and the central processing unit 2. The two sensors 17, 19 are powered by a battery (not shown in the figures) within the casing.

The angular sensor 17, for example of the resolver type, is configured to measure the angle, over 360°, that the chassis forms with respect to an origin position O defined during the calibration of the angular sensor 17.

The distance sensor 18 may be of the taut wire type and comprise a rigid cable 15 able to be pulled out of the casing over a maximum distance of 2 meters (m). The cable is wound on a drum, contained inside the casing, the spindle of which is coupled to an electronic measuring device. Any change in the distance separating the free end 16 of the cable from the casing causes a rotational movement of the drum.

This rotational movement is then converted and transmitted in the form of an electrical signal by the electronic device, for example an encoder.

The communications unit 19 is connected to each of the two sensors 17, 18 and comprises an antenna one end of which is situated on the end 16 of the cable. The end 16 of the cable also comprises a button (not shown in the figures) which, when actuated, triggers the transmission, by the antenna to the central processing unit 2, of a signal validating the electrical signals coming from the sensors.

The central processing unit 2 of the tablet 5 in a known manner groups all of the elements of a computer (non-transitory memory, processor, wireless communications interface) and ensures the operation of the tablet 5. The central processing unit 2 uses a general interface which, in a known manner, allows an operator of the tablet to interact with the latter, for example by enlarging/reducing, pointing to certain elements displayed on the screen 6, selecting tap zones (buttons) provided for this purpose. Moreover, the central processing unit 2 is configured to send data, via a wireless link, to an external network NET.

The central processing unit 2 uses an interface, called the user interface, via which an operator can use the acquisition module 10 to carry out distance and angle measurements. The user interface calls upon three databases DB1, DB2 and DB3 each containing data relative to the aircraft on which the device 1 according to the invention can be used.

The first database DB1 comprises data obtained by assisted three-dimensional modeling of the fuselage (skin and structure) of different modeled aircraft. The data in the first database DB1 comprise the modeling of the outer skin, notably the curvatures, the modeling of the internal structural elements of the fuselage (frames, stringers, floors), as well as the modeling of the distinctive elements of the outer surface of the fuselage (for example: the cabin windows, the doors, the probes, the antennas, etc.). The operator accessing the first database DB1 via the user interface is able to display on the screen 6 a virtual model (or DMU: Digital Mock-Up) of the fuselage, which can be displayed in a simplified manner, where only the outer surface of the fuselage and its distinctive elements are displayed, or in a complex mode where all of the elements are shown. The general interface of the tablet, compatible with the user interface, allows the operator to enlarge/reduce, to shift the view, or to move a pointer over the virtual model, which is in simplified mode or in complex mode.

Figure 3:
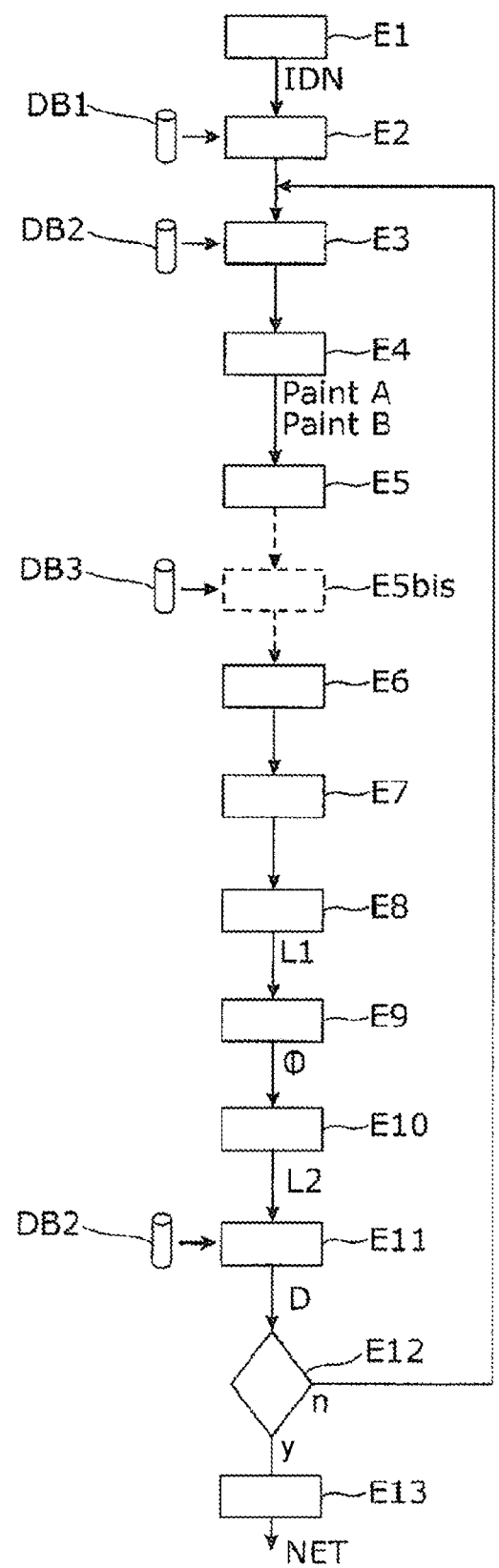
FIG. 3 is a diagram showing an implementation of the device for locating impacts according to the invention in order to facilitate the determination of the coordinates of an impact on the fuselage of an aircraft using a virtual model of said fuselage.
Figure 4:
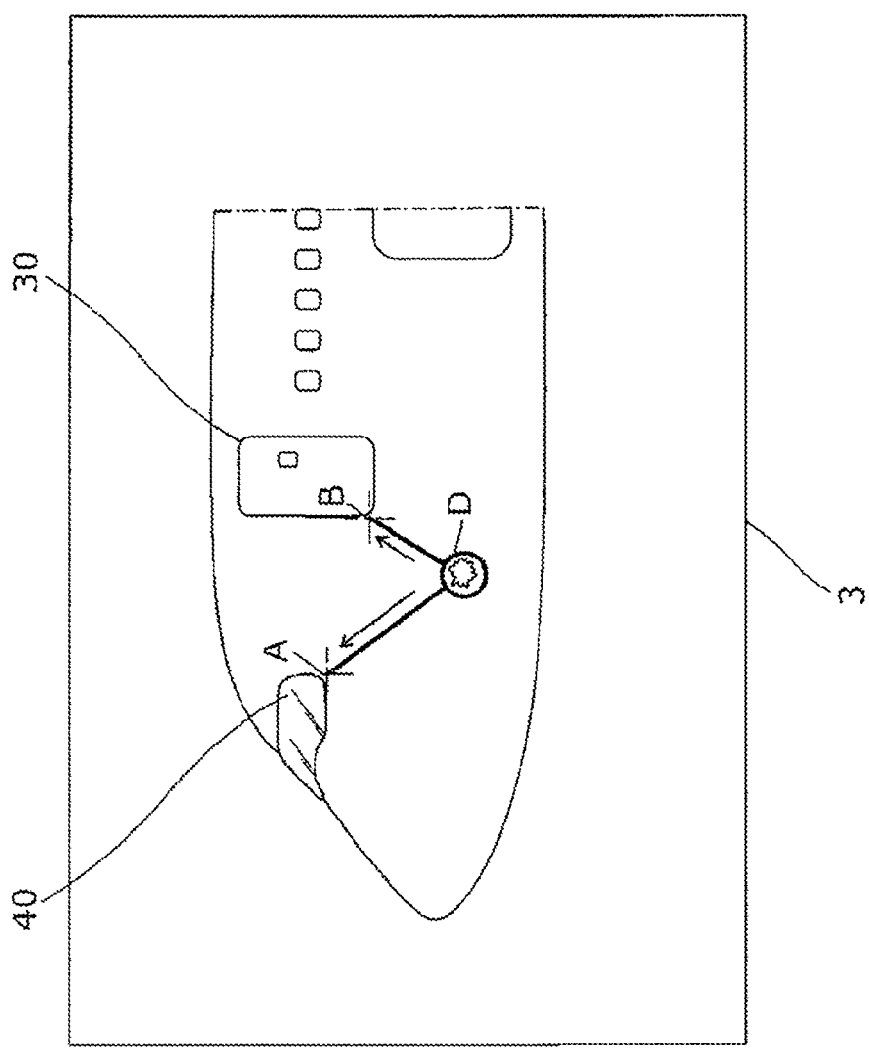
FIG. 4 is a screen image of a virtual model of the fuselage of an aircraft displayed on the touch-sensitive screen of the tablet shown in FIG. 1 during a step of implementation shown in the diagram of FIG. 3.

The second database DB2 comprises the coordinates, in the first database, of visual reference elements of the outer surface of the fuselage making it possible to take measurements via the acquisition module 10 as will be described below with reference to FIGS. 3 and 4. The reference elements can be displayed in extra brightness on the simplified virtual model. The visual reference elements are particular points of the distinctive elements of the skin of the fuselage and are, for example: the corner of a cabin window, the corner of a door, the base of a probe, etc.

A third database DB3 comprises at least one color photograph of each of the visual reference elements for a modeled aircraft.

The locating, by an operator of an entity responsible for the inspection of the aircraft (airline company, manufacturer), of an impact on the fuselage of an aircraft by means of the locating device according to the invention will now be described with reference to FIGS. 3 and 4.

In a first step E1, the operator detects an impact on the fuselage of the aircraft and notes the identifiers of the aircraft IDN (registration, series, tail number, model).

In a second step E2, by means of the touch-sensitive tablet 5, the operator interacts with the user interface via which he enters the identifier of the aircraft IDN. The central processing unit 2, by accessing the first database DB1, displays the virtual model of the fuselage of the aircraft thus identified on the screen 6.

In a third step E3, by means of the touch-sensitive tablet 5 and via a touch interaction, the operator points to an (estimated) position of the impact on the simplified virtual model. The compatibility between the general interface and the user interface allows the operator to enlarge an area of the simplified virtual model corresponding to the estimated area of the impact. Moreover, if the real fuselage comprises decorative stickers, the user interface comprises filters making it possible to display or not to display these stickers on the simplified virtual model in order to assist the operator.

The central processing unit 2 displays, on the screen 6, a marker, for example a cross, on the simplified virtual model, at the place where the operator has pointed to the position of the impact. The central processing unit 2 accesses the second database DB2 and displays in extra brightness, on the simplified virtual model (DB1), at least two visual elements of references situated around the marker.

In a fourth step E4, the operator chooses, from among the displayed visual reference elements, two visual elements of references by interacting with the user interface. In the example shown in FIG. 4, the operator has chosen a first reference element, indicated by point A, as being the lower left corner of the side window of the cockpit and the second reference element, indicated by point B, as being the lower left corner of the front evacuation door, situated on the left hand side of the fuselage.

In a fifth step E5, the operator fixes, with the suction cups 12, the acquisition module 10 on the fuselage in such a way that the center of the plate 11 is situated over the impact. In order to carry out the measurements of curvilinear distances to determine the position of the impact, the operator will have to position the end of the cable 16 on the point A and the on the point B. Also, in an optional step E5*bis*, by means of the touch-sensitive tablet 5, the operator can interact with one or other of the two visual reference elements chosen and displayed in extra brightness on the simplified virtual model, which initiates the accessing, by the central processing unit 2, of the third database DB3. The operator can then be assisted by the photograph or photographs of the point A or of the point B if he has a doubt regarding the exact position of the point A or of the point B.

In a sixth step E6, by means of the touch-sensitive tablet 5, the operator initiates, by interacting with a button of the user interface, the mode for acquisition of physical data of the impact. Once this mode is engaged, the two sensors 17, 18 of the acquisition module 10 transmit, via the communications unit 19, their output signals (distance, angle) to the central processing unit 2. Moreover, when this mode is started, instructions for measurements relative to the two chosen reference elements are displayed on the screen 6 intended for the operator.

Thus, in a seventh step E7, by means of the acquisition module 10, the operator unwinds the cable 15 of the distance sensor 17 until the free end 16 of the cable touches the point A.

In an eighth step E8, by means of the antenna of the communications unit 19, the operator indicates to the central processing unit 2, by interacting with a button of the antenna of the communications unit 19, that the distance measurement, denoted L1, between the impact and the point A is completed. The central processing unit 2 then records the distance measurement extracted from the signal transmitted by the distance sensor 17 together with the angle θ (the angle between the chassis and the origin position O during the measurement of the distance L1) extracted from the signal transmitted by the angle sensor 18.

In a ninth step E9, the operator rotates the measuring device 14 though an angle φ with respect to the plate 11 in order to position the cable 15 in the direction of the point B and unwinds the cable 15 of the distance sensor until the free end 16 of the cable touches the point B.

In a tenth step E10, the operator indicates to the central processing unit 2, by interacting with the button located on the end 16 of the cable, that the distance measurement, denoted L2, between the impact and the point B is completed. The central processing unit 2 then records the distance measurement extracted from the signal transmitted by the distance sensor 17 together with the angle Ω, where Ω=θ+φ (φ>0 if the rotation took place in the clockwise direction and φ<0 if the rotation took place in the anticlockwise direction), extracted from the signal transmitted by the angle sensor 18. The central processing unit 2 calculates the angle φ, whose vertex is the point of impact, between the point A and the point B.

In an eleventh step E11, the central processing unit 2 calculates, on the complex virtual model, and by means of a so-called curvilinear triangulation operation, the coordinates of the impact D as a function of the measurements (L1 and L2) taken on the real fuselage and of the coordinates of the points A and B recorded in the database DB2.

Hereafter, the term "tracer" will refer to a segment that follows the lines of the external structure of the fuselage of the virtual model. A tracer can thus be a curved segment when it follows a curved shape of the external surface of the virtual model.

The curvilinear triangulation used by the central processing unit 2 comprises the plot, on the external structure of the complex virtual model, on the basis of the coordinates of the point A and over 360°, with an angular pitch of alpha, of a plurality of tracers of length L1 and, on the basis of the coordinates of the point B and over 360°, with an angular pitch of alpha, of a plurality of tracers of length L2. The ends of the tracers of length L1 define a contour C1 around the point A and the ends of the tracers of length L2 define a contour C2 around the point B. The contours C1, C2 are not necessarily circular as they take into account the curved shape of the fuselage of the aircraft. The intersection of the contours C1 and C2 occurs at two points, a point P and the point D. The point P is deleted by the operator.

In a twelfth step E12, the central processing unit 2 checks the plausibility of the calculation carried out in the preceding step E11. In the step E12, the value of the angle φ is compared with a predefined value, to within a margin of error. The predefined value of the angle φ is calculated as a function of the coordinates of the point A and of the coordinates of the point B.

This comparison makes it possible to ensure that the operator has not confused the visual reference element with another visual reference element, which can occur notably in the case where a visual reference element is a corner of a cabin window taken from among a row of cabin windows. If the difference between the predefined value and the measured value is greater than the margin of error, the user interface informs the operator that the measurements of distances are incorrect and provides him with instructions to have another look at the chosen reference elements and to restart the measurements (cf. E3).

If the difference between the predefined value and the measured value remains less than or equal to the margin of error then the operator is informed by the user interface that the measurement is correct. In this case, the user interface displays a marker on the point D on the virtual model and determines the numbers of the stringers and of the frames closest to the point D. At the request of the operator, the stringers and frames closest to the point D are displayed in extra brightness on the complex virtual model.

In a thirteenth step E13, the central processing unit 2, informs the operator of the coordinates of the point D as well as of the number of the frame and the number of the stringer that are closest to the point D. Moreover, at the request of the operator, the central processing unit 2 records the coordinates of the point D as well as the numbers of the stringers and frames closest to the point D in a shared database via a network NET of the entity responsible for the inspection of the aircraft. These items of information are thus quickly made available to experts responsible for making a decision with regard to keeping the impacted aircraft in service. An operator, provided with the device according to the invention will moreover be able, during a subsequent maintenance inspection, be able to access the shared database in order to consult the history of the aircraft.

The methods and systems disclosed herein may be embodied in a device for locating impacts which requires of the operator only a little knowledge of the structure of the fuselage of the aircraft and thus makes it possible for a large number of operators to carry out this locating. The device has the advantage of being usable by an operator who is not familiar with the structure of the aircraft in question, such as a member of the ground staff at an airport. Because of the invention, the planning of inspections of aircraft is no longer subject to the constraints of availability of a small number of persons.

Moreover, the methods and systems disclosed herein allow a rapid provision of the historical data of the impacts of an aircraft and quickly provides the coordinates of the impact, with respect to the stringer and frame numbers, to the entity responsible for the maintenance of the aircraft.

It will be noted that the methods and systems described above calls upon a complex virtual model and upon a simplified virtual model of the fuselage, and it does so in order to optimize the speed of execution of the locating method by not overloading the computing capability of the central processing unit for certain steps where the modeling of the internal structure of the fuselage is not necessary. However, the complex virtual model could be used alone.

In the above description of the curvilinear triangulation, it was stated that the point P is deleted by the operator who interacts with the tablet 5. In a variant, this deletion is carried out automatically by the central processing unit 2. In this case the instructions given by the operator in the sixth step E6 tell the operator to start the measurements with the point A and then with the point B. The central processing unit is therefore capable of distinguishing the two points P and D because of the sign of the angle φ and of the knowledge of the first visual reference point, that is to say the point A, that was taken into account for the measurements.

The invention is applicable, besides the fuselage, to the wings of the aircraft and also to other bodies such as for example boat hulls.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s).

In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise.

The invention claimed is:

1. A method for locating an impact on an outer surface of a body comprising:
   accessing a virtual model of the body stored in a database, wherein the virtual model is a preexisting, three-dimensional model of the body that includes an outer surface and an internal component adjacent the outer surface;
   locating, via a man-machine interface, the impact on the outer surface of the virtual model of the body displayed on a display screen;
   selecting a first and a second visual reference element on the virtual model of the body, wherein the first and a second visual reference elements are preexisting structures on the body;
   positioning an acquisition module on the outer surface of the body at the impact, wherein the acquisition module comprises an angular sensor and a distance sensor that includes a wire;
   measuring, using the acquisition module, a first curvilinear distance between the impact and the first visual reference element on the body and a second curvilinear distance between the impact and the second visual reference element on the body by extending the wire between the acquisition module and the first and second visual reference elements;
   calculating, by a central processing unit and as a function of the first and second distances, a first contour around the first visual reference element on the virtual model and a second contour around the second visual reference element;
   determining, by the central processing unit, a point of intersection of the first and second contours;
   calculating, by the central processing unit, coordinates of said point of intersection on the virtual model of the body, and the coordinates of said point as being representative of the coordinates of the impact, and
   generating by the central processing unit a presentation presenting the coordinates of the impact.

2. The method as claimed in claim 1, wherein the body comprises an internal structure formed by an assembly of first and second structural elements, and the method further comprises:
   determining, on the virtual model, the first and second structural elements closest to the coordinates of said point and the presentation includes the first and second elements.

3. The method as in claim 1, wherein the measuring of the distances comprises the measuring of an angle (φ) having a vertex at the impact and extending between lines defined by the vertex and the first and second visual reference elements.

4. The method as in claim 3 further comprising comparing by the central processing unit a measured value of the angle (φ) and a predefined value, and determining the distances between the impact and each of the visual reference elements to be invalid if the measured value of said angle (φ) differs from the predefined value by more than a margin of error.

5. The method as in claim 1 further comprising recording the coordinates of the point of intersection in a database.

6. A device for locating an impact on an outer surface of a body comprising:
   a central processing unit including a non-transitory memory;
   a display device in communication with the central processing unit;
   a man-machine interface in communication with the central processing unit, and
   an acquisition module in communication with the central processing unit, wherein the acquisition module comprises an angular sensor and a distance sensor that includes a wire;
   a first database comprising a preexisting, three-dimensional model of the body that includes an outer surface and an internal component adjacent the outer surface;
   a second database comprising coordinates of visual reference elements on the modeled body,
   wherein the central processing unit executes instructions stored on the non-transitory memory to cause the device to:
   access the three-dimensional model of the body in the first database;
   receive impact data from the man-machine interface, wherein the impact data represents a location on the display device selected by an operator as corresponding to a location of the impact on an outer surface of the three-dimensional model of the body being displayed on the display device;
   select a first and a second visual reference element on the three-dimensional model of the body, wherein the first and a second visual reference elements are preexisting structures on the body and the wire is extendible between the acquisition module and the first and second visual reference elements;
   receiving distance data from the acquisition module positioned on the outer surface of the body at the impact, and the distance data including a first curvilinear distance between the impact and the first visual reference element on the body, and a second curvilinear distance between the impact and the second visual reference element on the body;
   calculating, as a function of the curvilinear distances, a first contour about the first visual reference element and a second contour about the second visual reference element;
   determining a point of intersection of the first and second contours;
   calculating coordinates of said point of intersection on the three-dimensional model of the body, the coordinates of said point being representative of the coordinates of the impact, and
   displaying on the display device information correlating the point of intersection to the location of the impact generating by the central processing unit.

7. The device of claim 6 wherein the acquisition module comprises a base and a measuring device fixed to the base via a chassis mounted such that the measuring device rotates on the base.

8. The device of claim 7, wherein the base comprises a suction device for fixing the base to the outer surface of the body.

9. The device of claim 7 wherein the measuring device includes a distance sensor configured to measure a distance between said acquisition module and a visual reference element.

10. The device as in claim 9 wherein the distance sensor includes a rigid wire.

11. The device as in claim 7 wherein the angular sensor is configured to measure an angle formed by the chassis with respect to an origin position.

12. A method to identifying an internal support structures proximate to an impact on an outer surface of a body of a device, the method comprising:

identifying, using a man-machine interface, a location on a virtual model of the device stored on a non-transitory memory and shown on a display screen corresponding to a location of the impact on the outer surface of the body, wherein the virtual model is a preexisting, three-dimensional model of the body that includes an outer surface and an internal component adjacent the outer surface;

selecting, using the man-machine interface, a first visual reference element and a second visual reference element each on the virtual model, wherein the first and a second visual reference elements are preexisting structures on the body;

positioning an acquisition module proximate to the outer surface of the body at the impact, wherein the acquisition module comprises an angular sensor and a distance sensor that includes a wire, and using the positioned acquisition module to measure a first curvilinear distance along the outer surface and between the impact and the first visual reference element on the body by extending the wire between acquisition module and the first visual reference element, and a second curvilinear distance along the outer surface and between the impact and the second visual reference element on the body by extending the wire between acquisition module and the second visual reference element;

plotting by a central processing unit a first virtual contour based on first curvilinear distance measured by the acquisition module and the first visual reference element;

plotting by the central processing unit a second virtual contour based on the second curvilinear distance measured by the acquisition module and the second visual reference element;

determining by the central processing unit a point on the surface of the virtual model corresponding to an intersection of a first and second virtual contours;

calculating coordinates of the intersection on the virtual model and determining the coordinates correspond to the impact on the virtual model;

identifying internal structures proximate to the impact based on the impact located on the virtual model and data regarding internal structures obtained from the virtual model, and generating a presentation of the identified internal structures proximate to the impact.

13. The method of claim 12 wherein the identified internal structures include stringers or frames of the nearest the point of impact.

14. The method of claim 12 wherein the body is a fuselage of an aircraft.

15. The method of claim 12 further comprising measuring an angle having a vertex at the impact and extending between lines defined by the impact and each of the first and second visual reference elements, and invalidating the calculated coordinates of the point of intersection if the angle is greater than a predefined angle.

16. The method as in claim 12 further comprising measuring an angle having a vertex at the impact and extending between lines defined by the impact and each of the first and second visual reference elements, and the determination of the point includes determining the angle is less than a predefined angle, and invalidating the calculated coordinates of the point of intersection if the angle differs from a predefined angle by more than a margin of error.

* * * * *